(12) United States Patent
Sato et al.

(10) Patent No.: US 10,980,112 B2
(45) Date of Patent: Apr. 13, 2021

(54) MULTILAYER WIRING BOARD

(71) Applicant: Murata Manufacturing Co., Ltd., Nagaokakyo (JP)

(72) Inventors: Takako Sato, Nagaokakyo (JP); Takeshi Osuga, Nagaokakyo (JP); Masanori Okamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/708,558

(22) Filed: Dec. 10, 2019

(65) Prior Publication Data

US 2020/0113050 A1 Apr. 9, 2020

Related U.S. Application Data

(63) Continuation of application No. PCT/JP2018/019785, filed on May 23, 2018.

(30) Foreign Application Priority Data

Jun. 26, 2017 (JP) .............................. JP2017-124124

(51) Int. Cl.
*H05K 1/09* (2006.01)
*H05K 1/03* (2006.01)
(Continued)

(52) U.S. Cl.
CPC .............. *H05K 1/092* (2013.01); *H05K 1/036* (2013.01); *H05K 1/115* (2013.01); *H05K 3/4038* (2013.01);
(Continued)

(58) Field of Classification Search
CPC ........ H05K 1/092; H05K 1/036; H05K 1/115; H05K 3/4038; H05K 3/4676; H05K 2201/09563
(Continued)

(56) References Cited

U.S. PATENT DOCUMENTS 5,877,559 A 3/1999 Takayama et al.
2002/0086145 A1 7/2002 Yazaki et al.
(Continued)

FOREIGN PATENT DOCUMENTS

JP 8-340025 A 12/1996
JP 2000-216514 A 8/2000
(Continued)

OTHER PUBLICATIONS

Official Communication issued in International Patent Application No. PCT/JP2018/019785, dated Aug. 14, 2018.

*Primary Examiner* — Tremesha S Willis
(74) *Attorney, Agent, or Firm* — Keating & Bennett, LLP

(57) ABSTRACT

A multilayer wiring board includes first and second insulating layers, a first conductive wiring layer on the first insulating layer, a second conductive wiring layer on a surface of the second insulating layer facing the first insulating layer, an interlayer connection conductor including an intermetallic compound and penetrating through the first insulating layer to interconnect the first and second conductive wiring layers, a first intermetallic compound layer between the first conductive wiring layer and the interlayer connection conductor, and a second intermetallic compound layer between the second conductive wiring layer and the interlayer connection conductor, wherein the intermetallic compounds in the first and second intermetallic compound layers have a composition different from that of the intermetallic compound in the interlayer connection conductor, and the first intermetallic compound layer is located at a level different from a level of an interface between the first conductive wiring layer and the first insulating layer.

29 Claims, 3 Drawing Sheets

(51) Int. Cl.
*H05K 1/11* (2006.01)
*H05K 3/40* (2006.01)
*H05K 3/46* (2006.01)

(52) U.S. Cl.
CPC . *H05K 3/4676* (2013.01); *H05K 2201/09563* (2013.01); *H05K 2201/09827* (2013.01)

(58) Field of Classification Search
USPC .......................................................... 174/258
See application file for complete search history.

(56) References Cited

U.S. PATENT DOCUMENTS

2010/0307807 A1 12/2010 Noda et al.
2010/0307809 A1 12/2010 Noda et al.
2013/0299219 A1 11/2013 Chisaka et al.

FOREIGN PATENT DOCUMENTS

| | | |
|---|---|---|
| JP | 2003-110211 A | 4/2003 |
| JP | 2003-110243 A | 4/2003 |
| JP | 2005-136347 A | 5/2005 |
| JP | 2009-188146 A | 8/2009 |
| JP | 2010-287878 A | 12/2010 |
| JP | 2010-287879 A | 12/2010 |
| JP | 2011-210794 A | 10/2011 |
| JP | 2011-253993 A | 12/2011 |
| JP | 2012-227207 A | 11/2012 |
| JP | 2013-229421 A | 11/2013 |
| JP | 2014-75456 A | 4/2014 |
| JP | 2015-103766 A | 6/2015 |
| WO | 2012/111711 A1 | 8/2012 |

# MULTILAYER WIRING BOARD

CROSS REFERENCE TO RELATED APPLICATIONS

This application claims the benefit of priority to Japanese Patent Application No. 2017-124124 filed on Jun. 26, 2017 and is a Continuation Application of PCT Application No. PCT/JP2018/019785 filed on May 23, 2018. The entire contents of each application are hereby incorporated herein by reference.

BACKROUND OF THE INVENTION

1. Field of the Invention

The present invention relates to a multilayer wiring board and a method of producing a multilayer wiring board.

2. Description of the Related Art

Examples of multilayer wiring boards for use in various electronic devices include a multilayer board disclosed in JP 2005-136347 A in which multiple layers of conductive patterns are laminated in a thermoplastic resin, wherein each conductive pattern includes a wiring part as a circuit part, a land as a connecting terminal to be electrically connected to the wiring part, and a metal pattern electrically isolated from the wiring part and the land.

In a multilayer wiring board such as the multilayer board disclosed in JP 2005-136347 A, generally, a conductive wiring layer is provided between insulating layers that are laminated, and the conductive wiring layers are connected together by an interlayer connection conductor provided inside the insulating layers.

The interlayer connection conductor is formed by, for example, forming a via hole that penetrates through the insulating layer and filling the via hole with a conductive paste.

The conductive paste usually includes a solvent to provide filling properties and the like. The solvent in the conductive paste needs to be removed by drying after filling, but in some cases, the solvent may not be completely removed due to insufficient drying or the like. In such cases, the residual solvent in the interlayer connection conductor is vaporized and expanded due to a heat treatment such as reflow. Thus, delamination occurs between the insulating layer and the conductive wiring layer due to gas released from the interlayer connection conductor, which may cause breakage in the interlayer connection conductor.

SUMMARY OF THE INVENTION

Preferred embodiments of the present invention provide multilayer wiring boards in each of which an interlayer connection conductor does not easily break, and methods of producing the multilayer wiring boards.

A multilayer wiring board according to a preferred embodiment of the present invention includes a first insulating layer; a second insulating layer stacked on the first insulating layer; a first conductive wiring layer on a surface of the first insulating layer on a side opposite to the second insulating layer; a second conductive wiring layer on a surface of the second insulating layer on the side facing the first insulating layer; an interlayer connection conductor including an intermetallic compound and penetrating through the first insulating layer in a stacking direction so as to interconnect the first conductive wiring layer and the second conductive wiring layer; a first intermetallic compound layer including an intermetallic compound between the first conductive wiring layer and the interlayer connection conductor; and a second intermetallic compound layer including an intermetallic compound between the second conductive wiring layer and the interlayer connection conductor, wherein the intermetallic compound in the first intermetallic compound layer and the intermetallic compound in the second intermetallic compound layer each have a composition different from the composition of the intermetallic compound in the interlayer connection conductor, and the first intermetallic compound layer is disposed at a level different from a level of the interface between the first conductive wiring layer and the first insulating layer in the stacking direction.

In a multilayer wiring board according to a preferred embodiment of the present invention, in a plan view in the stacking direction, preferably, at least a portion of the periphery of the first intermetallic compound layer is outside the periphery of the interface between the first intermetallic compound layer and the interlayer connection conductor.

In a multilayer wiring board according to a preferred embodiment of the present invention, preferably, the first insulating layer includes a projection covering the first intermetallic compound layer and the interlayer connection conductor.

In a multilayer wiring board according to a preferred embodiment of the present invention, preferably, the projection is in contact with the interface between the first intermetallic compound layer and the interlayer connection conductor, on the first conductive wiring layer side of the interface between the first conductive wiring layer and the first insulating layer.

In a multilayer wiring board according to a preferred embodiment of the present invention, preferably, a tip of the projection is surrounded by the first intermetallic compound layer.

In a multilayer wiring board according to a preferred embodiment of the present invention, preferably, the projection is extends obliquely from the interlayer connection conductor toward the first intermetallic compound layer, and from the periphery of the first intermetallic compound layer toward the center thereof.

In a multilayer wiring board according to a preferred embodiment of the present invention, preferably, the tip of the projection has a rounded shape at least at a portion in contact with the interface between the first intermetallic compound layer and the interlayer connection conductor, and more preferably, the tip of the projection entirely has a rounded shape.

In a multilayer wiring board according to a preferred embodiment of the present invention, preferably, the interlayer connection conductor has a tapered shape in which the area connected to the first intermetallic compound layer is smaller than the area connected to the second intermetallic compound layer.

In a multilayer wiring board according to a preferred embodiment of the present invention, preferably, the tapered shape has an inclination angle that changes stepwise.

In a multilayer wiring board according to a preferred embodiment of the present invention, preferably, the first insulating layer and the second insulating layer are each made of a thermoplastic resin. The thermoplastic resin is preferably a liquid crystal polymer.

In a multilayer wiring board according to a preferred embodiment of the present invention, preferably, the first conductive wiring layer and the second conductive wiring layer are each made of Cu.

In a multilayer wiring board according to a preferred embodiment of the present invention, preferably, the intermetallic compound in the interlayer connection conductor includes Sn.

In a multilayer wiring board according to a preferred embodiment of the present invention, preferably, the intermetallic compound in the first intermetallic compound layer and the intermetallic compound in the second intermetallic compound layer each include Cu and Sn.

A method of producing a multilayer wiring board according to a preferred embodiment of the present invention includes preparing an insulating sheet including a conductive wiring layer on one surface; forming a via hole that penetrates through the insulating sheet and that exposes a portion of a top surface of the conductive wiring layer; etching an exposed portion of the conductive wiring layer; filling the via hole with a conductive paste including a first metal powder and a second metal powder having a higher melting point than the first metal powder; and stacking a plurality of the insulating sheets each including a via hole filled with the conductive paste, and collectively compressing the insulating sheets by heat treatment.

In a method of producing the multilayer wiring board according to a preferred embodiment of the present invention, preferably, the first metal powder is made of Sn or a Sn alloy, and the second metal powder is made of a Cu—Ni alloy or a Cu—Mn alloy.

In a method of producing the multilayer wiring board according to a preferred embodiment of the present invention, preferably, the conductive wiring layer includes copper foil.

In a method of producing the multilayer wiring board according to a preferred embodiment of the present invention, preferably, the via hole has a tapered shape whose diameter decreases toward the conductive wiring layer.

Preferred embodiments of the present invention provide multilayer wiring boards in each of which an interlayer connection conductor does not easily break.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, multilayer wiring boards and methods of producing the multilayer wiring board according to preferred embodiments of the present invention will be described in detail below with reference to the drawings.

The present invention is not limited to the following preferred embodiments of the present invention, and may be suitably modified without departing from the gist of the present invention. Combinations of two or more preferred features described in the following preferred embodiments are also within the scope of the present invention.

Multilayer Wiring Board

Figure 1:
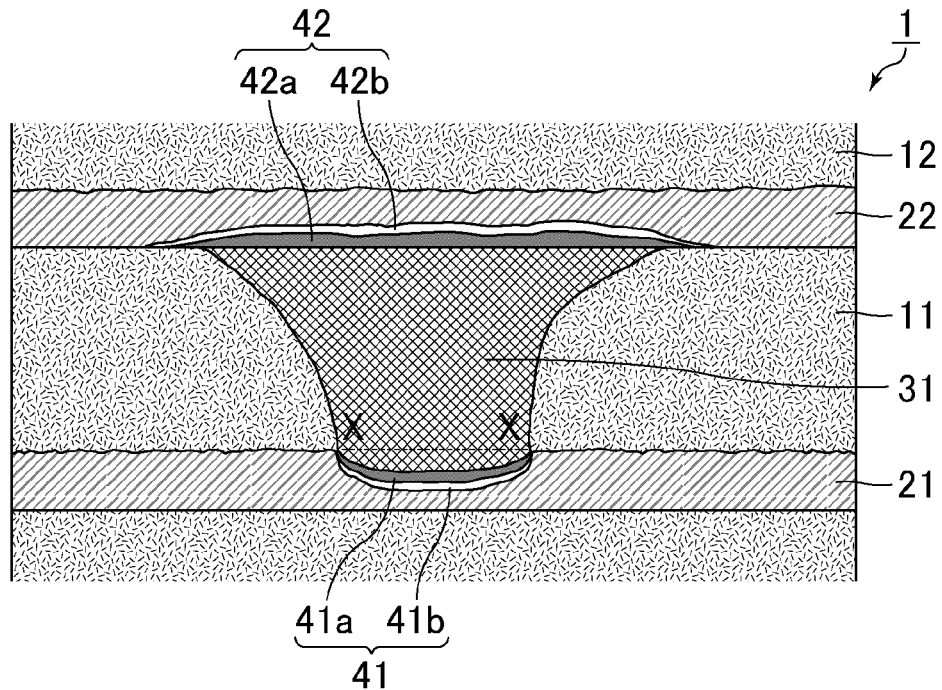
FIG. 1 is a schematic cross-sectional view of an example of a multilayer wiring board according to a preferred embodiment of the present invention.

FIG. 1 is a schematic cross-sectional view of an example of a multilayer wiring board according to a preferred embodiment of the present invention.

Although an overall configuration is not shown in FIG. 1, a multilayer wiring board 1 at least includes a first insulating layer 11 and a second insulating layer 12 stacked on the first insulating layer 11.

A first conductive wiring layer 21 on a surface of the first insulating layer 11 is disposed on a side opposite to the second insulating layer 12, and a second conductive wiring layer 22 is disposed on a surface of the second insulating layer 12 on a side facing the first insulating layer 11. In FIG. 1, the surface of the first conductive wiring layer 21 on the side facing the first insulating layer 11 is a matte surface having a higher surface roughness than the surface on the side opposite to the first insulating layer 11, and the surface of the second conductive wiring layer 22 on the side facing the first insulating layer 11 is a shiny surface having a lower surface roughness than the surface on the side opposite to the first insulating layer 11.

Inside the first insulating layer 11, an interlayer connection conductor 31 penetrates through the first insulating layer 11 in a stacking direction (a vertical direction in FIG. 1). The interlayer connection conductor 31 includes an intermetallic compound, and interconnects the first conductive wiring layer 21 and the second conductive wiring layer 22.

A first intermetallic compound layer 41 is disposed between the first conductive wiring layer 21 and the interlayer connection conductor 31. A second intermetallic compound layer 42 is disposed between the second conductive wiring layer 22 and the interlayer connection conductor 31. The first intermetallic compound layer 41 and the second intermetallic compound layer 42 each include an intermetallic compound.

The intermetallic compound in the first intermetallic compound layer 41 and the intermetallic compound in the second intermetallic compound layer 42 each preferably have a composition different from the composition of the intermetallic compound in the interlayer connection conductor 31. In FIG. 1, the first intermetallic compound layer 41 preferably has a bilayer structure including layers 41a and 41b each including an intermetallic compound with a different composition. The second intermetallic compound layer 42 preferably has a bilayer structure including layers 42a and 42b each including an intermetallic compound with a different composition.

The term "different composition" as used herein not only encompasses a case where the composition is different, i.e., the intermetallic compounds include different types of elements, but also a case where the intermetallic compounds include the same types of elements but at a different ratio. For example, $Cu_3Sn$ and $Cu_6Sn_5$ have the same composition but at a different compositional ratio, and are thus considered to be "different compositions".

The difference in composition between the intermetallic compounds can be confirmed in a simplified manner by cross-sectional observation under a metal microscope. For more detail, the composition of each intermetallic compound can be confirmed by compositional analysis by energy dispersive X-ray spectrometry (EDX) or the like and crystal structure analysis by micro X-ray diffraction or the like.

In the multilayer wiring board 1 shown in FIG. 1, the first intermetallic compound layer 41 is disposed at a level different from the level of the interface between the first conductive wiring layer 21 and the first insulating layer 11 in the stacking direction. In FIG. 1, the interface between the first intermetallic compound layer 41 and the interlayer connection conductor 31 is positioned on the first conductive wiring layer 21 side of the interface (the surface indicated by X-X in FIG. 1) between the first conductive wiring layer 21 and the first insulating layer 11.

In the multilayer wiring board of the present preferred embodiment, the first intermetallic compound layer is disposed at a level different from the level of the interface between the first conductive wiring layer and the first insulating layer in the stacking direction.

As described later, in the multilayer wiring board of the present preferred embodiment, the interlayer connection conductor is made with a conductive paste. Specifically, metals in the conductive paste react with each other to produce an intermetallic compound, thus providing an interlayer connection conductor. In addition, a metal in the interlayer connection conductor and a metal of the conductive wiring layer react with each other between the interlayer connection conductor and the conductive wiring layer to produce an intermetallic compound having a composition different from the composition of the intermetallic compound in the interlayer connection conductor, thus providing the intermetallic compound layer.

As described above, the conductive paste usually includes a solvent, and the solvent may not be completely removed in some cases. The solvent is included in the interlayer connection conductor and in the interface between the interlayer connection conductor and the conductive wiring layer. When the solvent is vaporized and expanded, delamination occurs at the interface between the insulating layer and the conductive wiring layer along with an increase in volume. When delamination at the interface between the insulating layer and the conductive wiring layer extends toward the interlayer connection conductor, delamination also occurs at the interface between the interlayer connection conductor and the conductive wiring layer. In particular, the intermetallic compound layer provided between the interlayer connection conductor and the conductive wiring layer is more fragile than the interlayer connection conductor and the conductive wiring layer, and is thus more susceptible to breakage. Therefore, when the most fragile intermetallic compound layer is flush with the interface between the conductive wiring layer and the insulating layer, a position at which delamination stress is applied coincides with the weakest position, and the delamination stress is thus directly transferred.

In contrast, in the multilayer wiring board of the present preferred embodiment, the first intermetallic compound layer is disposed at a level different from the level of the interface between the first conductive wiring layer and the first insulating layer in the stacking direction. Thus, the stress is dispersed, and the delamination stress is less likely to be transferred to the interface between the first intermetallic compound layer and the interlayer connection conductor. As a result, breakage of the interlayer connection conductor can be prevented.

In the multilayer wiring board of the present preferred embodiment, when the first intermetallic compound layer is disposed at a level different from the level of the interface between the first conductive wiring layer and the first insulating layer in the stacking direction, the first intermetallic compound layer does not cross the interface between the first conductive wiring layer and the first insulating layer. In addition, when the first intermetallic compound layer is disposed at a level different from the level of the interface between the first conductive wiring layer and the first insulating layer in the stacking direction, as shown in FIG. 1, preferably, the interface between the first intermetallic compound layer and the interlayer connection conductor is located on the first conductive wiring layer side of the interface between the first conductive wiring layer and the first insulating layer.

In the multilayer wiring board of the present preferred embodiment, the second intermetallic compound layer may or may not be disposed at a level different from the level of the interface between the second conductive wiring layer and the first insulating layer in the stacking direction.

For example, in the multilayer wiring board 1 shown in FIG. 1, the second intermetallic compound layer 42 is not disposed at a level different from the level of the interface between the second conductive wiring layer 22 and the first insulating layer 11 in the stacking direction. In FIG. 1, the interface between the second intermetallic compound layer 42 and the interlayer connection conductor 31 is flush or substantially flush with the interface between the second conductive wiring layer 22 and the first insulating layer 11.

Figure 2:
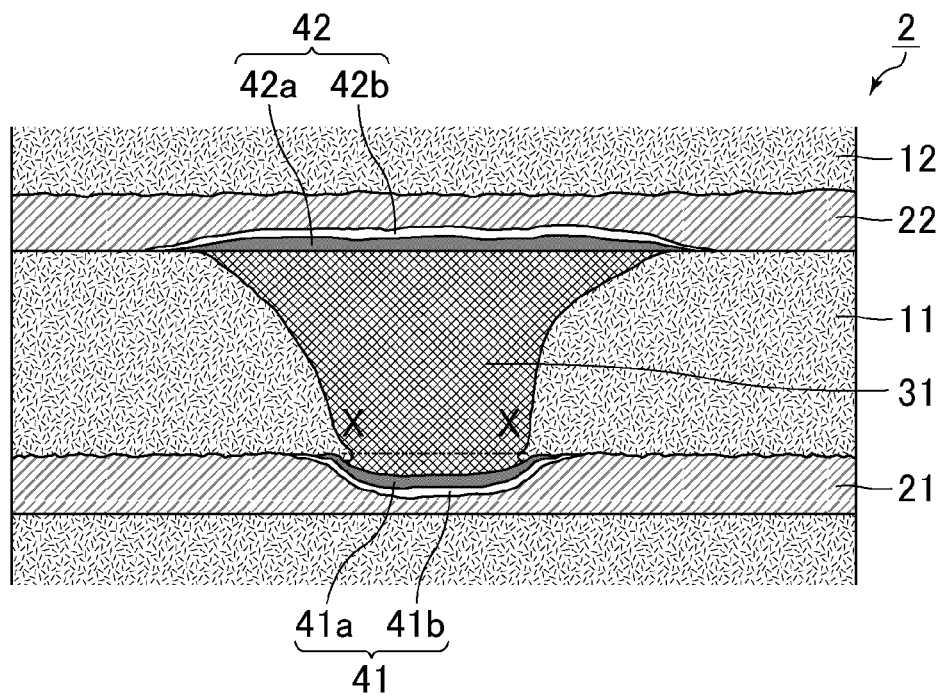
FIG. 2 is a schematic cross-sectional view of another example of a multilayer wiring board according to a preferred embodiment of the present invention.
Figure 3:
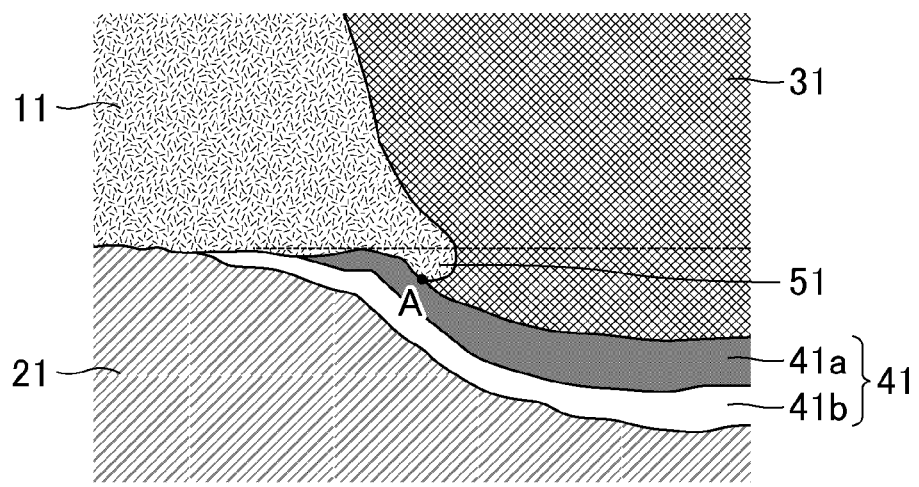
FIG. 3 is an enlarged cross-sectional view of a portion of the multilayer wiring board shown in FIG. 2.

FIG. 2 is a schematic cross-sectional view of another example of a multilayer wiring board according to a preferred embodiment of the present invention. FIG. 3 is an enlarged cross-sectional view of a portion of the multilayer wiring board shown in FIG. 2.

Unlike the multilayer wiring board 1 shown in FIG. 1, in a multilayer wiring board 2 shown in FIG. 2, the first intermetallic compound layer 41 extends outside the interlayer connection conductor 31. As in the multilayer wiring board 1 shown in FIG. 1, the interface between the first intermetallic compound layer 41 and the interlayer connection conductor 31 is located on the first conductive wiring layer 21 side of the interface (the surface indicated by X-X in FIG. 2) between the first conductive wiring layer 21 and the first insulating layer 11. Thus, also in the multilayer wiring board 2 shown in FIG. 2, the first intermetallic compound layer 41 is disposed at a level different from the level of the interface between the first conductive wiring layer 21 and the first insulating layer 11 in the stacking direction.

In addition, in the multilayer wiring board 2 shown in FIG. 2, as shown in FIG. 3, the first insulating layer 11 includes a projection 51 covering the first intermetallic compound layer 41 and the interlayer connection conductor 31.

Herein, in the cross-sectional view in the stacking direction as shown in FIG. 2 and FIG. 3, when the first insulating layer includes a portion in contact with the first intermetallic compound layer on the first conductive wiring layer side in the stacking direction and a portion in contact with the interlayer connection conductor on the first conductive wiring layer side in the stacking direction, such a configuration is described as "the first insulating layer has a projection covering the first intermetallic compound layer and the interlayer connection conductor". In particular, in the first insulating layer, a portion that includes the interface with the first intermetallic compound layer and the interface with the interlayer connection conductor and that enters the interlayer connection conductor is referred to as a "tip of the projection".

As described above, in the multilayer wiring board of the present preferred embodiment, the first insulating layer preferably includes a projection covering the first intermetallic compound layer and the interlayer connection conductor.

When the first insulating layer includes a projection as shown in FIG. 3, the interface between the first intermetallic compound layer and the interlayer connection conductor can be supported by the first insulating layer, so that the stress is further less likely to be transferred to the interface between the first intermetallic compound layer and the interlayer connection conductor. As a result, it is possible to further prevent breakage of the interlayer connection conductor which starts from the interface between the first intermetallic compound layer and the interlayer connection conductor.

In the multilayer wiring board of the present preferred embodiment, as shown in FIG. 3, preferably, the projection is in contact with the interface between the first intermetallic compound layer and the interlayer connection conductor on the first conductive wiring layer side of the interface between the first conductive wiring layer and the first insulating layer. In FIG. 3, the projection 51 is in contact with the interface between the first intermetallic compound layer 41 and the interlayer connection conductor 31 at point A.

In this case, the interface between the first intermetallic compound layer and the interlayer connection conductor is shifted from the interface between the first conductive wiring layer and the first insulating layer, so that the stress upon delamination between the first insulating layer and the first conductive wiring layer is less likely to be transferred to the interface between the first intermetallic compound layer and the interlayer connection conductor. As a result, it is possible to reduce or prevent breakage of the interlayer connection conductor which starts from the interface between the first intermetallic compound layer and the interlayer connection conductor.

When the projection is in contact with the interface between the first intermetallic compound layer and the interlayer connection conductor, on the first conductive wiring layer side of the interface between the first conductive wiring layer and the first insulating layer, preferably, the projection makes contact at two positions in one cross section in the stacking direction as shown in FIG. 2 and also at two positions in a cross section perpendicular or substantially perpendicular to the one cross section.

In the multilayer wiring board of the present preferred embodiment, as shown in FIG. 3, preferably, the projection is extends obliquely from the interlayer connection conductor toward the first intermetallic compound layer, and from the periphery of the first intermetallic compound layer toward the center thereof.

With the projection extended obliquely, it is possible to sufficiently support the interface between the first intermetallic compound layer and the interlayer connection conductor.

In the multilayer wiring board of the present preferred embodiment, preferably, the tip of the projection has a rounded shape at least at a portion in contact with the interface between the first intermetallic compound layer and the interlayer connection conductor, and more preferably, the tip of the projection entirely has a rounded shape.

When the tip of the projection has a rounded shape, the stress can be dispersed without being concentrated.

Figure 4:
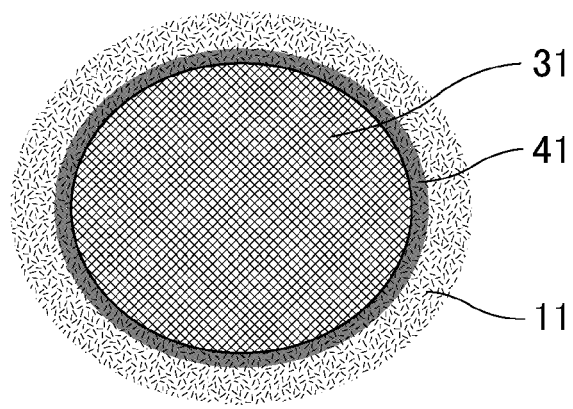
FIG. 4 is a plan view of the multilayer wiring board shown in FIG. 2 seen from a stacking direction.

FIG. 4 is a plan view of the multilayer wiring board shown in FIG. 2 seen from a stacking direction. FIG. 4 is a plan view of a portion on the first conductive wiring layer side of the interface (the surface indicated by X-X in FIG. 2) between the first conductive wiring layer and the first insulating layer in the stacking direction.

In FIG. 4, the periphery of the first intermetallic compound layer 41 is outside the periphery of the interface between the first intermetallic compound layer 41 and the interlayer connection conductor 31. The first intermetallic compound layer 41 outside the interlayer connection conductor 31 is covered with the first insulating layer 11 (also see FIG. 3).

As described above, in the multilayer wiring board of the present preferred embodiment, in a plan view in the stacking direction, preferably, at least a portion of the periphery of the first intermetallic compound layer is outside the periphery of the interface between the first intermetallic compound layer and the interlayer connection conductor.

In this case, since the first intermetallic compound layer has a larger area connected to the first conductive wiring layer, it is possible to increase the bonding strength between the first intermetallic compound layer and the first conductive wiring layer.

In a plan view in the stacking direction, the periphery of the first intermetallic compound layer may not be entirely outside the periphery of the interface between the first intermetallic compound layer and the interlayer connection conductor as long as at least a portion of the periphery of the first intermetallic compound layer is outside the periphery of the interface between the first intermetallic compound layer and the interlayer connection conductor.

In the multilayer wiring board of the present preferred embodiment, when at least a portion of the periphery of the first intermetallic compound layer is outside the periphery of the interface between the first intermetallic compound layer and the interlayer connection conductor, the first insulating layer may not include the projection.

In the multilayer wiring board of the present preferred embodiment, as shown in FIG. 3 and FIG. 4, preferably, a tip of the projection is surrounded by the first intermetallic compound layer.

Herein, in the cross-sectional view in the stacking direction as shown in FIG. 2 and FIG. 3, when the first insulating layer is disposed between the first intermetallic compound layer and the interlayer connection conductor in a direction perpendicular or substantially perpendicular to the stacking direction, such a configuration is described as that "the tip of the projection is surrounded by the first intermetallic compound layer".

When the tip of the projection is surrounded by the first intermetallic compound layer, preferably, the tip of the projection is surrounded at two positions in one cross section in the stacking direction as shown in FIG. 2 and also at two positions in a cross section perpendicular or substantially perpendicular to the one cross section. As shown in FIG. 4, it is most preferred that the tip of the projection is entirely surrounded by the first intermetallic compound layer.

In the multilayer wiring boards according to preferred embodiments of the present invention, as shown in FIG. 1 and FIG. 2, preferably, the interlayer connection conductor has a tapered shape in which the area connected to the first intermetallic compound layer is smaller than the area connected to the second intermetallic compound layer.

When the interlayer connection conductor has the tapered shape, the second intermetallic compound layer has a larger area connected to the second conductive wiring layer, so that it is possible to increase the bonding strength between the second intermetallic compound layer and the second conductive wiring layer.

In the multilayer wiring boards according to preferred embodiments of the present invention, preferably, the tapered shape has an inclination angle that changes stepwise. In this case, the inclination angle may change in two steps, or three or more steps, for example.

Insulating Layer

The insulating layers such as the first insulating layer and the second insulating layer are preferably made of, for example, electrically insulating, plate-shaped or film-shaped resin sheets. The resin used for the resin sheets may be a thermoplastic resin or a thermosetting resin, for example, but a thermoplastic resin is preferred. With the use of a thermoplastic resin sheet, a plurality of the resin sheets each including the conductive wiring layer can be stacked and collectively compressed by heat treatment.

Examples of the thermoplastic resin include liquid crystal polymers (LCP), thermoplastic polyimide resins, polyether ether ketone (PEEK) resins, and polyphenylene sulfide (PPS) resins. Of these, liquid crystal polymers (LCP) are preferred. Liquid crystal polymers have a lower water absorption rate than other thermoplastic resins. Thus, the amount of residual water in the insulating layers can be reduced in the multilayer wiring board including insulating layers made of a liquid crystal polymer, which can further prevent breakage of the interlayer connection conductor.

Interlayer Connection Conductor

The interlayer connection conductor includes an intermetallic compound. Preferably, the interlayer connection conductor includes an intermetallic compound between a first metal and a second metal having a higher melting point than the first metal. Preferably, such an interlayer connection conductor is made of a sintered conductive paste. For example, a conductive paste including a first metal powder and a second metal powder having a higher melting point than the first metal powder is used to cause a reaction between the first metal and the second metal, thus providing an interlayer connection conductor including the intermetallic compound. The conductive paste including the first metal powder and the second metal powder is described below.

Method of Producing the Multilayer Wiring Board

The intermetallic compound in the interlayer connection conductor preferably includes Sn, and more preferably a combination of Cu, Ni, and Sn, or a combination of Cu, Mn, and Sn, for example.

Intermetallic Compound Layer

The first intermetallic compound layer and the second intermetallic compound layer each include an intermetallic compound. The intermetallic compound in the first intermetallic compound layer and the intermetallic compound in the second intermetallic compound layer each have a composition different from the composition of the intermetallic compound in the interlayer connection conductor. The composition of the intermetallic compound in the first intermetallic compound layer may be the same as or different from the composition of the intermetallic compound in the second intermetallic compound layer. Preferably, such a first intermetallic compound layer and such a second intermetallic compound layer are formed by a reaction of the first metal in the conductive paste with the metal defining the conductive wiring layer.

Preferably, the intermetallic compound in the first intermetallic compound layer and the intermetallic compound in the second intermetallic compound layer each include Cu and Sn, for example. More preferably, these intermetallic compounds are free or substantially free of either Ni or Mn, for example.

The first intermetallic compound layer and the second intermetallic compound layer each may include only one layer, or may include two or more layers each including an intermetallic compound with a different composition.

Conductive Wiring Layer

The conductive wiring layers such as the first conductive wiring layer and the second conductive wiring layer may be conductive wiring layers used for known wiring boards. Examples of materials of the conductive wiring layer include copper (Cu), silver (Ag), aluminum (Al), stainless steel (SUS), nickel (Ni), gold (Au), and alloys thereof.

The first conductive wiring layer and the second conductive wiring layer are each preferably made of copper (Cu), for example. In addition, the first conductive wiring layer and the second conductive wiring layer are each preferably made of conductive foil, particularly preferably copper foil, for example.

The first conductive wiring layer and the second conductive wiring layer each preferably have a matte surface on one of the surfaces, and a shiny surface on the other surface.

Method of Producing the Multilayer Wiring Board

The following describes a preferred embodiment of a method of producing a multilayer wiring board of the present invention.

FIGS. 5A to 5F are each schematic cross-sectional views of a non-limiting example of a method of producing the multilayer wiring board shown in FIG. 2.

Preparing Insulating Sheet

Figure 5A:
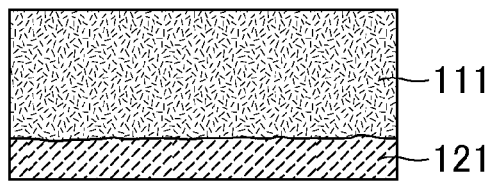
FIGS. 5A to 5F are each schematic cross-sectional views of an example of a method of producing the multilayer wiring board shown in FIG. 2.

As shown in FIG. 5A, an insulating sheet 111 is prepared which includes a conductive wiring layer 121 on one surface. In FIG. 5A, the insulating sheet 111 turns into the first insulating layer 11, and the conductive wiring layer 121 turns into the first conductive wiring layer 21.

Examples of methods of forming the conductive wiring layer include a method of forming a wiring circuit by etching conductive foil attached to a surface of an insulating sheet, a method of transferring conductive foil in the form of a wiring circuit to an insulating sheet, and a method of forming a wiring circuit on a surface of an insulating sheet by plating, for example.

The insulating sheet may be, for example, an insulating resin sheet including a resin such as the above-described thermoplastic resin. The insulating sheet is preferably a thermoplastic resin sheet, and more preferably a liquid crystal polymer resin sheet. The insulating sheet preferably has a thickness of about 10 μm or more and about 2000 μm or less, for example.

Examples of materials of the conductive foil include copper, silver, aluminum, stainless steel, nickel, gold, and alloys thereof. Copper, for example, is preferred. Thus, the conductive wiring layer is preferably formed with copper foil. The thickness of the conductive foil is preferably, for example, about 3 μm or more and about 40 μm or less.

In order to increase adhesiveness with the insulating sheet such as the resin sheet, roughening treatment may be performed on one side of the conductive foil. The surface roughness (Rz) of the roughened surface is preferably, for example, about 1 μm or more and about 15 μm or less.

Forming Via Hole

Figure 5B:
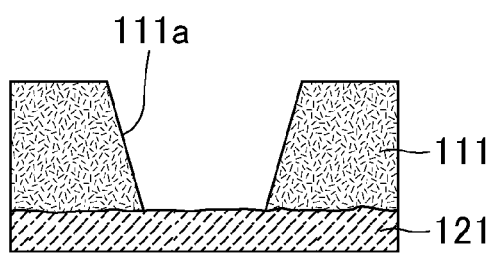

As shown in FIG. 5B, a via hole 111a is formed which penetrates through the insulating sheet 111 and which exposes a portion of a top surface of the conductive wiring layer 121.

For example, one surface of the insulating sheet on the side opposite to the conductive wiring layer is irradiated with a laser, such that a via hole that penetrates through the insulating sheet and that exposes a portion of a top surface of the conductive wiring layer is formed. Laser processing is performed using, for example, a pulse oscillation-type carbon dioxide laser processor. Preferably, desmear treatment is subsequently performed by, for example, oxygen plasma discharge treatment or corona discharge treatment, in order to remove resin residue inside the via hole. Alternatively, the resin residue may be removed by potassium permanganate treatment or the like, for example.

As shown in FIG. 5B, preferably, the via hole 111a in the insulating sheet 111 has a tapered shape whose diameter decreases toward the conductive wiring layer 121.

Etching Exposed Portion of Conductive Wiring Layer

Figure 5C:
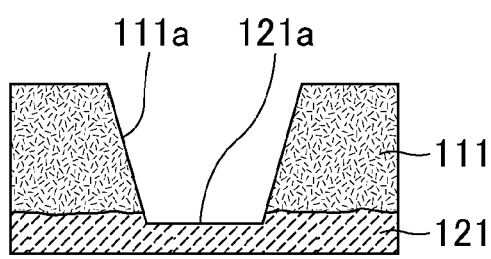

As shown in FIG. 5C, an exposed portion 121a of the conductive wiring layer 121 is etched. Thus, the exposed portion 121a of the conductive wiring layer 121 is located on the conductive wiring layer 121 side of the interface between the conductive wiring layer 121 and the insulating sheet 111.

Filling Via Hole with Conductive Paste

Figure 5D:
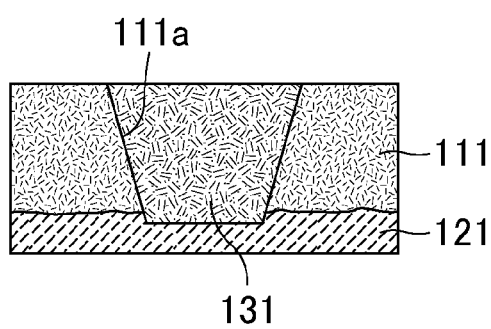

As shown in FIG. 5D, the via hole 111a is filled with the conductive paste 131 including the first metal powder and the second metal powder having a higher melting point than the first metal powder.

Examples of methods of filling a via hole with the conductive paste include the screen printing method and the vacuum filling method.

Preferably, the first metal powder in the conductive paste is made of Sn or a Sn alloy and the second metal powder therein is made of a Cu—Ni alloy or a Cu—Mn alloy, for example. Such a conductive paste may be, for example, a conductive paste disclosed in JP 5146627 B. Hereinafter, the metal component in the first metal powder is also referred to as a "first metal", and the metal component in the second metal powder is also referred to as a "second metal".

Examples of the Sn or Sn alloy include a simple substance of Sn and alloys including Sn and at least one selected from the group consisting of Cu, Ni, Ag, Au, Sb, Zn, Bi, In, Ge, Al, Co, Mn, Fe, Cr, Mg, Mn, Pd, Si, Sr, Te, and P. The Sn content of the Sn alloy is preferably about 70 wt % or more, and more preferably about 85 wt % or more, for example.

The proportion of Ni in the Cu—Ni alloy is preferably about 10 wt % or more and about 15 wt % or less. The proportion of Mn in the Cu—Mn alloy is preferably about 10 wt % or more and about 15 wt % or less. This enables supply of a necessary and sufficient amount of Ni or Mn to produce a desired intermetallic compound. When the proportion of Ni in the Cu—Ni alloy or the proportion of Mn in the Cu—Mn alloy is less than about 10 wt %, a portion of Sn tends to remain unreacted without being entirely converted into an intermetallic compound. Also when the proportion of Ni in the Cu—Ni alloy or the proportion of Mn in the Cu—Mn alloy is more than about 15 wt %, a portion of Sn tends to remain unreacted without entirely being converted into an intermetallic compound.

The Cu—Ni alloy or the Cu—Mn alloy may include both Mn and Ni or may include a third component such as P, for example.

The first metal powder and the second metal powder each preferably have an arithmetic mean particle size of about 3 µm or more and about 10 µm or less, for example. When the mean particle size of each metal powder is too small, it increases the production cost. In addition, such a metal powder tends to be oxidized quickly and interfere with a reaction. In contrast, when the mean particle size of each metal powder is too large, it is difficult to fill the via hole with the conductive paste.

The proportion of the second metal in the metal component of the conductive paste is preferably about 30 wt % or more, for example. In other words, the proportion of the first metal in the metal component of the conductive paste is preferably about 70 wt % or less, for example. In this case, the residual proportion of the first metal such as Sn is further decreased, allowing for an increase in the proportion of the intermetallic compound.

The proportion of the metal component in the conductive paste is preferably about 85 wt % or more and about 95 wt % or less, for example. When the proportion of the metal component is more than about 95 wt %, it is difficult to obtain a low-viscosity conductive paste having excellent filling properties. In contrast, when the proportion of the metal component is less than about 85 wt %, a flux component tends to remain.

The conductive paste preferably includes a flux component. Examples of the flux component include various known flux components as materials of conductive pastes, and the flux component includes a resin. Examples of components other than the resin include vehicles, solvents, thixotropic agents, and activators.

The resin preferably includes, for example, at least one thermosetting resin selected from the group consisting of epoxy resins, phenolic resins, polyimide resins, silicone resins or modified resins thereof, and acrylic resins, or at least one thermoplastic resin selected from the group consisting of polyamide resins, polystyrene resins, polymethacrylic resins, polycarbonate resins, and cellulose-based resins.

Examples of the vehicles include rosin-based resins and synthetic resins, which are obtained from rosin and rosin derivatives such as modified rosins or the like, and mixtures thereof. Examples of the rosin-based resins obtained from rosin and rosin derivatives such as modified rosins include gum rosin, tall rosin, wood rosin, polymerized rosin, hydrogenated rosin, formylated rosin, rosin ester, rosin-modified maleic acid resin, rosin-modified phenolic resin, rosin-modified alkyd resin, and other various rosin derivatives. Examples of the synthetic resins obtained from rosin and rosin derivatives such as modified rosins include polyester resins, polyamide resins, phenoxy resins, and terpene resins.

Examples of the solvents include alcohols, ketones, esters, ethers, aromatics, and hydrocarbons. Specific examples include benzyl alcohol, ethanol, isopropyl alcohol, butanol, diethylene glycol, ethylene glycol, glycerol, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diisobutyl adipate, hexylene glycol, cyclohexane dimethanol, 2-terpinyloxy ethanol, 2-dihydroterpinyloxy ethanol, and mixtures thereof. Preferred among these are terpineol, ethylene glycol monobutyl ether, diethylene glycol monoethyl ether, and diethylene glycol monobutyl ether.

Specific examples of the thixotropic agents include hydrogenated castor oil, carnauba wax, amides, hydroxy fatty acids, dibenzylidene sorbitol, bis(p-methylbenzylidene)sorbitol, beeswax, stearamide, and ethylenebisamide hydroxystearate. The thixotropic agents can also be these thixotropic agents to which the following additives are added as needed: fatty acids such as caprylic acid, lauric acid, myristic acid, palmitic acid, stearic acid, and behenic acid; hydroxy fatty acids such as 1,2-hydroxystearic acid; antioxidants; surfactants; and amines.

Examples of the activators include amine hydrohalides, organohalogen compounds, organic acids, organic amines, and polyhydric alcohols.

Examples of the amine hydrohalides include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

Examples of the organohalogen compounds include chlorinated paraffins, tetrabromoethane, dibromopropanol, 2,3-dibromo-1,4-butanediol, 2,3-dibromo-2-butene-1,4-diol, and tris(2,3-dibromopropyl)isocyanurate.

Examples of the organic acid include malonic acid, fumaric acid, glycolic acid, citric acid, malic acid, succinic acid, phenyl succinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid.

Examples of the organic amine include monoethanolamine, diethanolamine, triethanolamine, tributylamine, aniline, and diethylaniline.

Examples of the polyhydric alcohol include erythritol, pyrogallol, and ribitol.

Stacking and Collectively Compressing Insulating Sheets

Figure 5E:
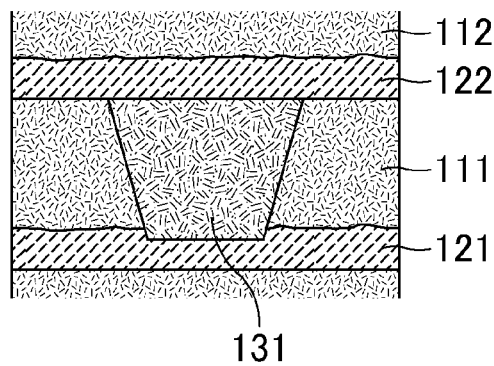

A plurality of the insulating sheets each including a via hole filled with a conductive paste as described above are stacked. In FIG. 5E, three insulating sheets including the insulating sheet 111 including a via hole filled with a conductive paste 131 are stacked. In FIG. 5E, an insulating sheet 112 turns into the second insulating layer 12, and a conductive wiring layer 122 turns into the second conductive wiring layer 22.

After stacking, the insulating sheets are collectively compressed by heat treatment. Thus, the insulating sheets turn into insulating layers. In particular, when a thermoplastic resin is used as a material of the insulating sheets, the insulating layers can be adhered to each other by collective compression.

Further, heat treatment is performed to cause a reaction between the first metal (e.g., Sn or a Sn alloy) and the second metal (e.g., a Cu—Ni alloy or a Cu—Mn alloy) in the conductive paste to produce an intermetallic compound, thus forming an interlayer connection conductor. Specifically, the first metal melts when the temperature of the conductive paste reaches the melting point or higher of the first metal, and further heating causes a reaction between the first metal and the second metal to produce an intermetallic compound.

In addition, at a contact portion between the conductive wiring layer and the interlayer connection conductor, a metal (e.g., Cu) forming the conductive wiring layer and the first metal (e.g., Sn or a Sn alloy) in the interlayer connection conductor react with each other to produce an intermetallic compound, thus forming the first intermetallic compound layer and the second intermetallic compound layer.

Here, on the first intermetallic compound layer side, the exposed portion of the conductive wiring layer has been etched as described above. Thus, the first intermetallic compound layer is disposed at a level different from the level of the interface between the first conductive wiring layer and the first insulating layer in the stacking direction. In contrast, the second intermetallic compound layer is disposed crossing the interface between the second conductive wiring layer and the first insulating layer, or disposed in contact with the interface between the second conductive wiring layer and the first insulating layer.

When the metal forming the conductive wiring layer reacts with the first metal in the interlayer connection conductor, the first metal is dispersed in the molten state. Thus, the periphery of the first intermetallic compound layer is outside the periphery of the interface between the first intermetallic compound layer and the interlayer connection conductor. Further, when a thermoplastic resin is used as a material of the insulating sheets, a softened thermoplastic resin enters the first intermetallic compound layer side upon compression, resulting in the formation of a projection on the insulating layer.

Figure 5F:
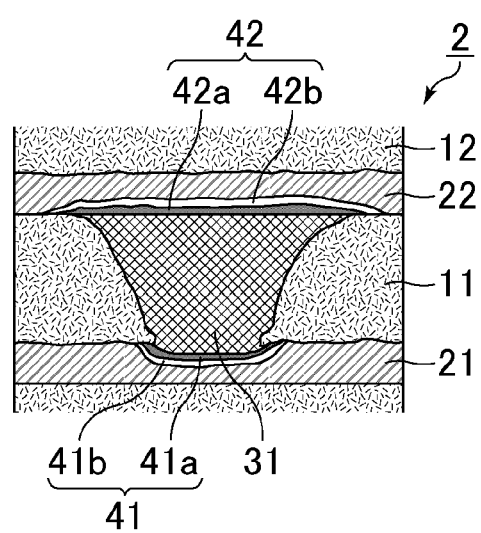

As a result, as shown in FIG. 5F, the multilayer wiring board 2 shown in FIG. 2 is obtained.

Preferably, the heat treatment temperature reaches a temperature higher than the melting point of the first metal at least for a certain period of time. When the heat treatment temperature does not reach a temperature higher than the melting point of the first metal, the first metal does not melt, thus failing to produce an intermetallic compound. For example, when the first metal powder is made of Sn or a Sn alloy, preferably, the heat treatment temperature reaches, for example, about 230° C. or higher for at least a certain period of time. The highest heat treatment temperature is preferably 350° C. or lower, for example. When the highest heat treatment temperature is higher than 350° C., for example, it may cause outflow of resin such as a liquid crystal polymer (LCP) defining the insulating sheet.

In the case of producing the multilayer wiring board 1 shown in FIG. 1, the temperature, pressure, and the like may be adjusted during heat treatment so that the first intermetallic compound layer can be formed such that the periphery of the first intermetallic compound layer is not outside the periphery of the interface between the first intermetallic compound layer and the interlayer connection conductor, or so that the first insulating layer can be formed such that no projection is present.

The multilayer wiring boards and the methods of producing the multilayer wiring board according to preferred embodiments of the present invention are not limited to the above-described preferred embodiments, and various modifications and changes may be made to the configurations of the multilayer wiring board, production conditions, and the like, within the scope of the present invention.

For example, in the multilayer wiring board 1 shown in FIG. 1 and the multilayer wiring board 2 shown in FIG. 2, the interface between the first intermetallic compound layer 41 and the interlayer connection conductor 31 is located on the first conductive wiring layer 21 side of the interface between the first conductive wiring layer 21 and the first insulating layer 11. Yet, in the multilayer wiring board of the present invention, the interface between the first intermetallic compound layer and the first conductive wiring layer may be located on the first insulating layer side of the interface between the first conductive wiring layer and the first insulating layer. Also in such a case, the first intermetallic compound layer is considered to be disposed at a level different from the level of the interface between the first conductive wiring layer and the first insulating layer in the stacking direction.

In the multilayer wiring board 1 shown in FIG. 1 and the multilayer wiring board 2 shown in FIG. 2, the interface between the second intermetallic compound layer 42 and the interlayer connection conductor 31 is flush or substantially flush with the interface between the second conductive wiring layer 22 and the first insulating layer 11. However, the second intermetallic compound layer may cross the interface between the second conductive wiring layer and the first insulating layer. Alternatively, the second intermetallic compound layer may be disposed at a level different from the level of the interface between the second conductive wiring layer and the first insulating layer in the stacking direction.

In the multilayer wiring board 1 shown in FIG. 1 and the multilayer wiring board 2 shown in FIG. 2, an additional insulating layer is stacked on the first insulating layer 11 on the side facing the first conductive wiring layer 21. However, an additional insulating layer may not be stacked on the first insulating layer on the side facing the first conductive wiring layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer wiring board comprising:
   a first insulating layer;
   a second insulating layer stacked on the first insulating layer;
   a first conductive wiring layer on a surface of the first insulating layer on a side opposite to the second insulating layer;
   a second conductive wiring layer on a surface of the second insulating layer on a side facing the first insulating layer;
   an interlayer connection conductor including an intermetallic compound and penetrating through the first insulating layer in a stacking direction so as to interconnect the first conductive wiring layer and the second conductive wiring layer;
   a first intermetallic compound layer including an intermetallic compound between the first conductive wiring layer and the interlayer connection conductor; and
   a second intermetallic compound layer including an intermetallic compound between the second conductive wiring layer and the interlayer connection conductor;
   wherein the intermetallic compound in the first intermetallic compound layer and the intermetallic compound in the second intermetallic compound layer each have a composition different from a composition of the intermetallic compound in the interlayer connection conductor;
   an interface between the first intermetallic compound layer and the interlayer connection conductor is positioned on a side of an interface between the first conductive wiring layer and the first insulating layer where the first conductive wiring layer is located; and
   the first intermetallic compound layer is located at a level different from a level of a--the interface between the first conductive wiring layer and the first insulating layer in the stacking direction.

2. The multilayer wiring board according to claim 1, wherein in a plan view in the stacking direction, at least a portion of a periphery of the first intermetallic compound layer is outside a periphery the interface between the first intermetallic compound layer and the interlayer connection conductor.

3. The multilayer wiring board according to claim 2, wherein the first insulating layer includes a projection covering the first intermetallic compound layer and the interlayer connection conductor.

4. The multilayer wiring board according to claim 3, wherein the projection is in contact with the interface between the first intermetallic compound layer and the interlayer connection conductor, on a first conductive wiring layer side of the interface between the first conductive wiring layer and the first insulating layer.

5. The multilayer wiring board according to claim 3, wherein a tip of the projection is surrounded by the first intermetallic compound layer.

6. The multilayer wiring board according to claim 3, wherein the projection extends obliquely from the interlayer connection conductor toward the first intermetallic compound layer, and from the periphery of the first intermetallic compound layer toward a center thereof.

7. The multilayer wiring board according to claim 3, wherein a tip of the projection has a rounded shape at least at a portion in contact with the interface between the first intermetallic compound layer and the interlayer connection conductor.

8. The multilayer wiring board according to claim 3, wherein a tip of the projection entirely has a rounded shape.

9. The multilayer wiring board according to claim 1, wherein the interlayer connection conductor has a tapered shape in which the area connected to the first intermetallic compound layer is smaller than the area connected to the second intermetallic compound layer.

10. The multilayer wiring board according to claim 9, wherein the tapered shape has an inclination angle that changes in a stepwise manner.

11. The multilayer wiring board according to claim 1, wherein the first insulating layer and the second insulating layer are each made of a thermoplastic resin.

12. The multilayer wiring board according to claim 11, wherein the thermoplastic resin is a liquid crystal polymer.

13. The multilayer wiring board according to claim 1, wherein the first conductive wiring layer and the second conductive wiring layer are each made of Cu.

14. The multilayer wiring board according to claim 1, wherein the intermetallic compound in the interlayer connection conductor includes Sn.

15. The multilayer wiring board according to claim 1, wherein the intermetallic compound in the first intermetallic compound layer and the intermetallic compound in the second intermetallic compound layer each include Cu and Sn.

16. A multilayer wiring board comprising:
   a first insulating layer;
   a second insulating layer stacked on the first insulating layer;
   a first conductive wiring layer on a surface of the first insulating layer on a side opposite to the second insulating layer;
   a second conductive wiring layer on a surface of the second insulating layer on a side facing the first insulating layer;
   an interlayer connection conductor including an intermetallic compound and penetrating through the first insulating layer in a stacking direction so as to interconnect the first conductive wiring layer and the second conductive wiring layer;
   a first intermetallic compound layer including an intermetallic compound between the first conductive wiring layer and the interlayer connection conductor; and a second intermetallic compound layer including an intermetallic compound between the second conductive wiring layer and the interlayer connection conductor; wherein the intermetallic compound in the first intermetallic compound layer and the intermetallic compound in the second intermetallic compound layer each have a composition different from a composition of the intermetallic compound in the interlayer connection conductor;

the first intermetallic compound layer is located at a level different from a level of an interface between the first conductive wiring layer and the first insulating layer in the stacking direction; and in a plan view in the stacking direction, at least a portion of a periphery of the first intermetallic compound layer is outside a periphery of an interface between the first intermetallic compound layer and the interlayer connection conductor.

17. The multilayer wiring board according to claim 16, wherein the first insulating layer includes a projection covering the first intermetallic compound layer and the interlayer connection conductor.

18. The multilayer wiring board according to claim 17, wherein the projection is in contact with the interface between the first intermetallic compound layer and the interlayer connection conductor, on a first conductive wiring layer side of the interface between the first conductive wiring layer and the first insulating layer.

19. The multilayer wiring board according to claim 17, wherein a tip of the projection is surrounded by the first intermetallic compound layer.

20. The multilayer wiring board according to claim 17, wherein the projection extends obliquely from the interlayer connection conductor toward the first intermetallic compound layer, and from the periphery of the first intermetallic compound layer toward a center thereof.

21. The multilayer wiring board according to claim 17, wherein a tip of the projection has a rounded shape at least at a portion in contact with the interface between the first intermetallic compound layer and the interlayer connection conductor.

22. The multilayer wiring board according to claim 17, wherein a tip of the projection entirely has a rounded shape.

23. The multilayer wiring board according to claim 16, wherein the interlayer connection conductor has a tapered shape in which the area connected to the first intermetallic compound layer is smaller than the area connected to the second intermetallic compound layer.

24. The multilayer wiring board according to claim 23, wherein the tapered shape has an inclination angle that changes in a stepwise manner.

25. The multilayer wiring board according to claim 16, wherein the first insulating layer and the second insulating layer are each made of a thermoplastic resin.

26. The multilayer wiring board according to claim 25, wherein the thermoplastic resin is a liquid crystal polymer.

27. The multilayer wiring board according to claim 16, wherein the first conductive wiring layer and the second conductive wiring layer are each made of Cu.

28. The multilayer wiring board according to claim 16, wherein the intermetallic compound in the interlayer connection conductor includes Sn.

29. The multilayer wiring board according to claim 16, wherein the intermetallic compound in the first intermetallic compound layer and the intermetallic compound in the second intermetallic compound layer each include Cu and Sn.

* * * * *